US007759740B1

(12) United States Patent
Masleid et al.

(10) Patent No.: US 7,759,740 B1
(45) Date of Patent: Jul. 20, 2010

(54) DEEP WELL REGIONS FOR ROUTING BODY-BIAS VOLTAGE TO MOSFETS IN SURFACE WELL REGIONS HAVING SEPARATION WELLS OF P-TYPE BETWEEN THE SEGMENTED DEEP N WELLS

(76) Inventors: Robert P. Masleid, 17266 Eaton La., Monte Sereno, CA (US) 95930; James B. Burr, 511 Broughton La., Foster City, CA (US) 94404

( * ) Notice: Subject to any disclaimer, the term of this patent is extended or adjusted under 35 U.S.C. 154(b) by 0 days.

(21) Appl. No.: 10/808,225

(22) Filed: Mar. 23, 2004

(51) Int. Cl.
*H01L 29/76* (2006.01)
*H01L 21/8238* (2006.01)
(52) U.S. Cl. ............... 257/371; 257/401; 257/E27.067
(58) Field of Classification Search ................ 257/369, 257/371, 372, 401, E27.067
See application file for complete search history.

(56) References Cited

U.S. PATENT DOCUMENTS

| | | | | |
|---|---|---|---|---|
| 3,772,097 | A | 11/1973 | Davis | ............... 438/395 |
| 4,907,058 | A | 3/1990 | Sakai | |
| 5,508,549 | A * | 4/1996 | Watanabe et al. | ........... 257/370 |
| 6,218,708 | B1 * | 4/2001 | Burr | ........................ 257/372 |
| 6,258,641 | B1 * | 7/2001 | Wong et al. | ............... 438/199 |
| 6,407,414 | B1 * | 6/2002 | Yu | .......................... 257/173 |
| 6,586,817 | B1 * | 7/2003 | Burr | ........................ 257/536 |
| 6,885,529 | B2 * | 4/2005 | Ker et al. | ...................... 361/56 |
| 6,900,091 | B2 * | 5/2005 | Williams et al. | ............ 438/228 |
| 6,936,898 | B2 * | 8/2005 | Pelham et al. | ............... 257/371 |
| 7,313,779 | B1 * | 12/2007 | Masleid et al. | ................. 716/18 |
| 2001/0028581 | A1 * | 10/2001 | Yanagisawa et al. | ... 365/189.05 |
| 2001/0033003 | A1 * | 10/2001 | Sawahata | ..................... 257/355 |
| 2002/0011633 | A1 * | 1/2002 | Kumagai | ..................... 257/393 |
| 2005/0068103 | A1 * | 3/2005 | Dupuis et al. | ............... 330/251 |
| 2005/0110574 | A1 * | 5/2005 | Richard et al. | .............. 330/297 |
| 2005/0133870 | A1 * | 6/2005 | Manna et al. | ................ 257/355 |
| 2006/0102958 | A1 * | 5/2006 | Masleid | ...................... 257/368 |

OTHER PUBLICATIONS

Y. Tsukikawa et al., An Efficient Back-Bias Generator with Hybrid Pumping Circuit for 1.5-V DRAM's. IEEE 1994, pp. 534-538.*
A. Yoshino et al., High Speed Performance of 0.35 micron CMOS Gates Fabricated on Low Dose Simox Substrates with/without N-Well Underneath the Burried Oxide Layer. IEEE 1995, pp. 14-15.*
Y. Moisiadis et al., High Performance Level Restoration Circuits for Low-Power Reduced Swing Interconnect Schemes. IEEE 2000, pp. 619-622.*
R. Ionita et al., Optimal Well Design for Triple-Well CMOS Digital Circuits with Back-Biasing Vt Control. IEEE 2005, pp. 389-392.*

* cited by examiner

*Primary Examiner*—Anh D Mai

(57) ABSTRACT

A deep n well capacitor. A deep n well is formed in an integrated circuit. The deep n well can be parasitically coupled to Vdd and ground. A reverse-biased diode depletion region forms between n type and p type material, creating a capacitor. The capacitor provides local, on-chip decoupling of power supplied to active transistor devices on the integrated circuit, enabling greater operating frequencies for the integrated circuit.

16 Claims, 4 Drawing Sheets

US 7,759,740 B1

DEEP WELL REGIONS FOR ROUTING BODY-BIAS VOLTAGE TO MOSFETS IN SURFACE WELL REGIONS HAVING SEPARATION WELLS OF P-TYPE BETWEEN THE SEGMENTED DEEP N WELLS

FIELD OF THE INVENTION

Embodiments in accordance with the present invention relate to systems and methods for adding capacitance to an integrated circuit.

BACKGROUND

Highly integrated semiconductor devices, e.g., microprocessors, are limited to a maximum frequency of operation that is in large part limited by transient current capabilities of the integrated circuit packaging. For example, an integrated circuit package introduces too much power supply inductance for the integrated circuit to achieve a desired operating frequency. The conventional art utilizes discrete capacitors within the packaging and explicitly constructed gate oxide capacitors. Such dedicated gate capacitors require a relatively large integrated circuit area, and are prohibitively expensive to achieve sufficient decoupling capacitance. Adding capacitors to the packaging incurs a deleterious increase in packaging cost and complexity, while decreasing reliability.

SUMMARY OF THE INVENTION

Therefore, a system of adding capacitance to an integrated circuit without sacrificing circuit area would be highly desirable.

Accordingly, a deep n well capacitor is disclosed. A deep n well is formed in an integrated circuit. The deep n well can be parasitically coupled to Vdd and ground in one example. A reverse-biased diode depletion region forms between n type and p type material, creating a capacitor. The capacitor provides local, on-chip decoupling of power supplied to active transistor devices on the integrated circuit, enabling greater operating frequencies for the integrated circuit.

In accordance with other embodiments of the present invention, multiple layers of deep n well can be configured as deep n well capacitors, increasing capacitance available in the integrated circuit.

DETAILED DESCRIPTION OF THE INVENTION

In the following detailed description of the present invention, deep n-well capacitor, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Deep n-Well Capacitor

Embodiments in accordance with the present invention are described in the context of design and operation of integrated semiconductors. More particularly, embodiments of the present invention relate to systems and methods adding capacitance to integrated circuits. It is appreciated, however, that elements of the present invention may be utilized in other areas of semiconductor operation.

Figure 1:
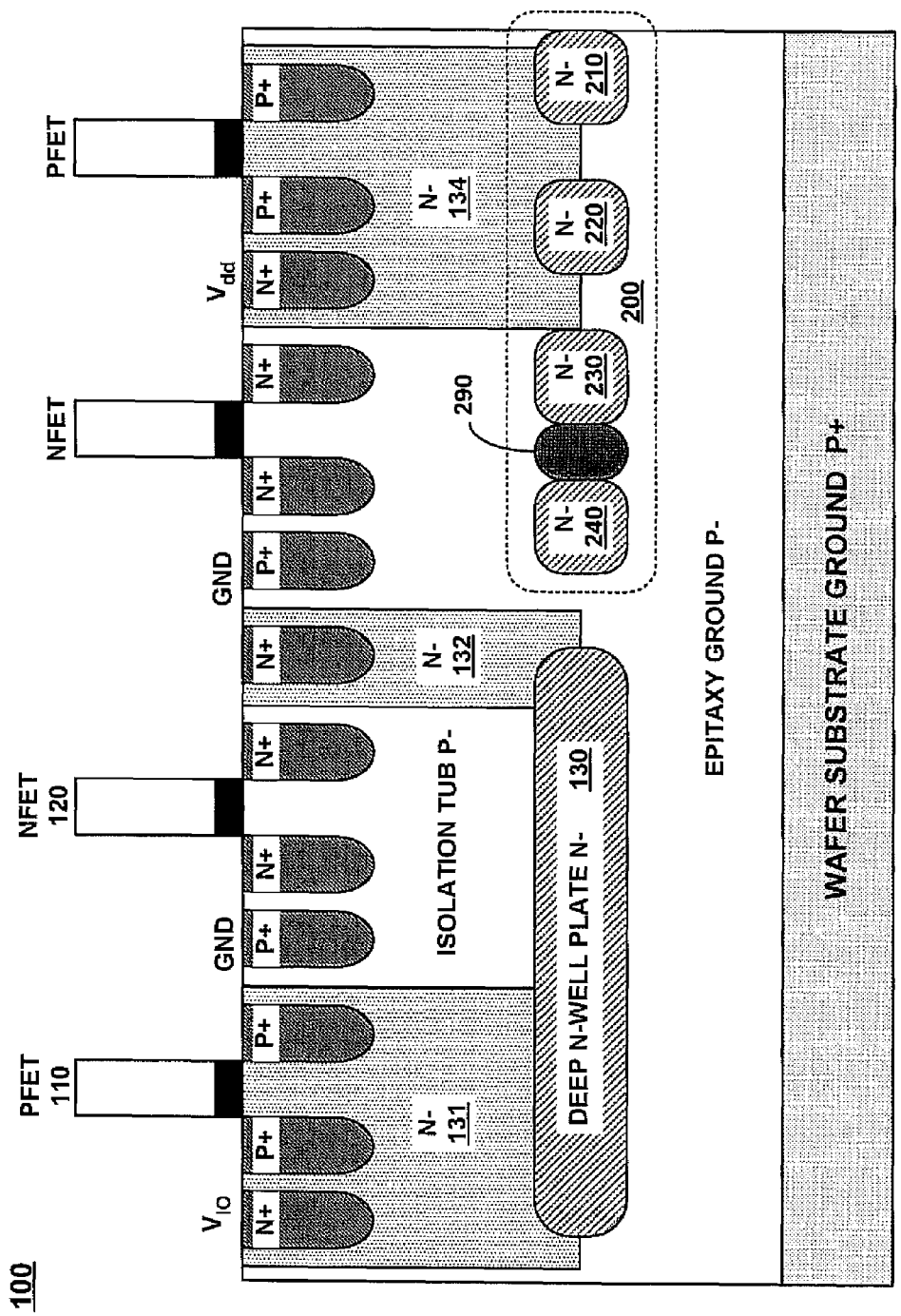
FIG. 1 illustrates a side-sectional view of an integrated circuit comprising deep n-well capacitor structure, in accordance with embodiments of the present invention.

FIG. 1 illustrates a side-sectional view of an integrated circuit 100 comprising deep n-well capacitor structure 200, in accordance with embodiments of the present invention.

Integrated circuit 100 comprises a plurality of p-channel field effect transistors (PFETs) and n-channel field effect transistors (NFETs), for example, PFET 110 and NFET 120. PFET 110 comprises source and drain structures of p+ type material within an n-type well. NFET 120 comprises source and drain structures of n+ type material within p type material, for example, p– epitaxial material or surface p-wells of a semiconductor wafer.

Deep n wells, e.g., deep n well plate 130, are conventionally disposed to isolate transistors operating at different voltages, for example input/output transistors, e.g., NFET 120. It is appreciated that deep n well 130, along with n-well regions 131 and 132, isolate NFET 120 from the epitaxy ground region of the semiconductor wafer.

It is appreciated that a capacitor is formed in a diode depletion region between n type and p type material. If such a capacitive structure is coupled between Vdd and ground, additional power supply decoupling can be provided on the integrated circuit.

Deep n well capacitor 200 is formed via a deep n well process, e.g., at the same depth and implant energy as deep n well plate 130. In contrast to the conventional art, however, the deep n well region of deep n well capacitor 200 should be segmented into many small regions, or sub structures, to provide connectivity between epitaxy (or bulk p) disposed beneath the deep n wells and the bodies of NFETs formed above the deep n wells. Also in contrast to the conventional art, deep n well capacitor 200 is coupled between Vdd and ground to supply on-chip decoupling capacitance.

It is to be appreciated that an effective capacitor exists between deep n well regions of deep n well capacitor 200, surface p wells and epitaxy p-material, between deep n well regions deep n well capacitor 200 and bulk p+ material, depending upon depth of the n well(s), and between deep n well regions deep n well capacitor 200 and any p wells or deep p wells.

Advantageously, deep n well capacitor 200 does not consume chip surface area. For example, the surface of the integrated circuit can be used for wiring, contacts and FET circuits. For example, when deep n well capacitor 200 crosses beneath an n well, e.g., n well 134, it is coupled to the n well due to the similar doping of the n well and deep n well structures. N wells are typically coupled to Vdd. Hence, deep n well capacitor 200 is coupled to Vdd. Advantageously, this coupling does not require wiring channels, contact structures or the like, nor does the coupling deleteriously diminish integrated circuit surface area.

Similarly, the ground coupling of deep n well capacitor 200 is provided through the p-wells and/or p– type epitaxy. It is appreciated that embodiments in accordance with the present invention are well suited to non-epitaxy wafers. For example, in the absence of p– epitaxy, deep n well capacitor 200 would parasitically couple to bulk p material as well as the p-wells. Epitaxy and/or bulk material are typically coupled to ground. Advantageously, this coupling also does not require wiring channels, contact structures or the like, nor does the coupling deleteriously diminish integrated circuit surface area.

It is to be appreciated that embodiments in accordance with the present invention are well suited to other well known forms of coupling to deep n wells, for example, contact structures.

Advantageously, typical layout rules utilized in the construction of deep n well layers are substantially relaxed in comparison to, for example, gate poly, contact and/or metal layers. As a beneficial consequence, the mask for a deep n well layer is relatively inexpensive, as is the incremental processing cost for adding a deep n well layer. Further, the addition of a deep n well layer has a negligible effect on process yield. Consequently, embodiments in accordance with the present invention can be added to an integrated circuit for very low cost.

Deep n well capacitor 200 comprises a plurality of sub structures, e.g., deep n well sub structures 210, 220, 230 and 240.

In a plan view, the deep n well sub structures may take a variety of shapes, for example, stripes, grids or meshes. In general, such sub structures should be parallel. However, they can cross or intersect. These shapes can be regular or irregular, making turns, etc., to avoid features, for example, a solid deep n well used for isolation, e.g., deep n well plate 130, or to make contact with an n well coupled to a desired voltage, e.g., n well 134. It is desirable to design and construct the gaps between deep n well sub structures wide enough that the gaps do not close under bias conditions. These gaps can supplement the lateral connection from the NFET bodies to the surface taps.

Optional separation p well 290 can be at substantially the same depth as, and between deep n well sub structures 230 and 240. Optional separation p well 290 can be used to increase the capacitance of deep n-well capacitor 200. Separation p well 290 can be used to increase coupling between epitaxy regions and NFET bodies. Separation p well 290 also reduces the separation required between deep n well sub structures 230 and 240 such that the gaps do not close under bias conditions. It is appreciated that separation p well 290 is not required. However, if separation p well was desired, a similar p well structure would typically be located in gaps between most deep n well sub structures.

It is to be appreciated that embodiments in accordance with the present invention are contrary to conventional uses of deep n well. Generally, semiconductor logical and physical design tools, e.g., a design rules checker, enforce a perimeter of n wells around, and coupled to deep n well structures.

For example, deep n well plate 130 surrounded by n wells 131 and 132, is compatible with conventional design tools. In contrast, sub structures of deep n well capacitor 200, in general, should not have a perimeter of n wells; rather they are substantially surrounded by p type material. For example, as described previously, it is desirable to have p material between deep n well capacitor sub structures to provide connectivity between epitaxy (or bulk p) and the bodies of NFETs. It is appreciated that deep n well capacitor sub structures should contact n wells somewhere, for conductivity reasons as described previously.

Within a semiconductor design, deep n well plates used conventionally for isolation should be given a unique logical identification. Likewise, deep n well capacitors should be given unique logical identifications. From a logical perspective, deep n well capacitors should not be shorted to other deep n well structures. In general, physical design rules checking should be adjusted to allow non-contiguous deep n well structures to be at the same potential and not enforce an n well perimeter on certain deep n well structures.

Figure 2A:
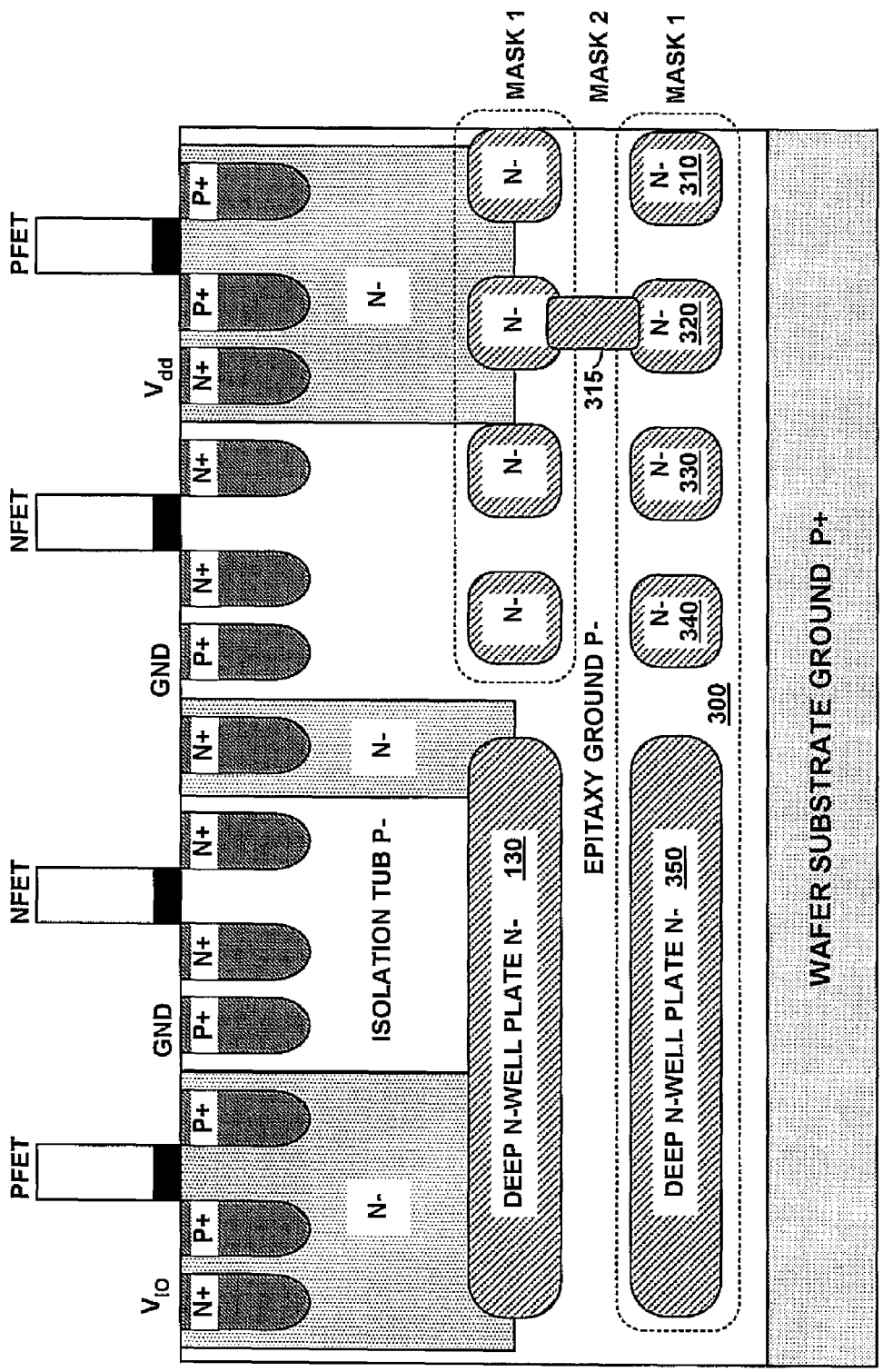
FIG. 2A illustrates using the same mask to form both a first and a second deep n well, in accordance with embodiments of the present invention.
Figure 2B:
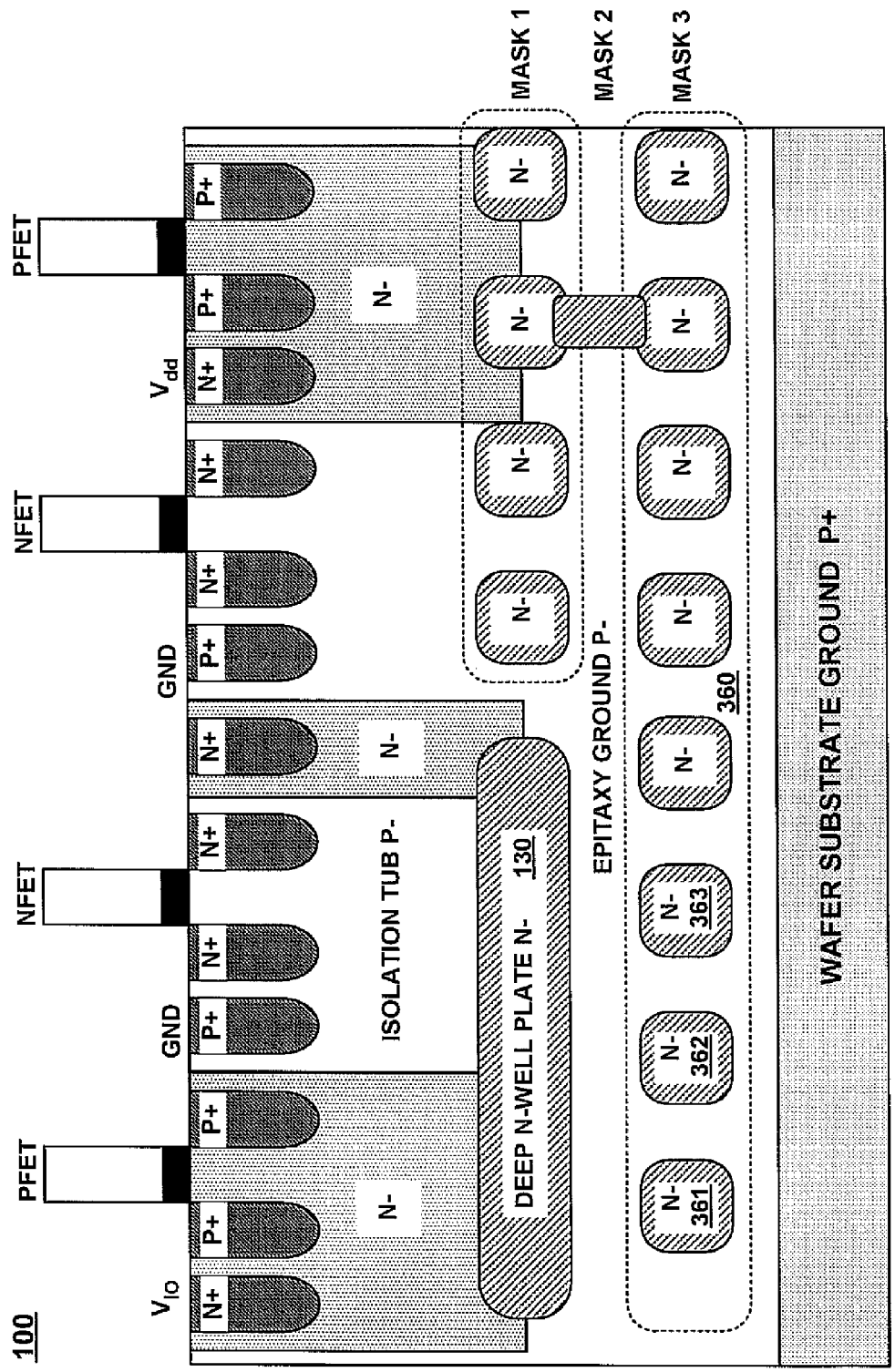
FIG. 2B illustrates a second deep n well layer formed using a different mask than a first deep n well layer, in accordance with embodiments of the present invention.

FIGS. 2A and 2B illustrate multiple layers of deep n well capacitors, in accordance with embodiments of the present invention. A "deeper" n well can be formed using a different ion implant energy than that which formed a first n well.

FIG. 2A illustrates using the same mask to form both a first and a second deep n well, in accordance with embodiments of the present invention. Deep n well capacitor 300 is formed separated from and beneath a deep n well layer comprising deep n well capacitor 200 and deep n well plate 130. For example, deep n well sub structures 310-340 are disposed directly beneath the corresponding deep n well sub structures 210-240. Likewise, a deep n well plate 350 is formed beneath deep n well plate 130. An implant of intermediate energy forms interlayer coupling 315, which couples deep n well capacitor 200 to deep n well capacitor 300. It is appreciated that in this exemplary embodiment, deep n well plate 350 is not coupled to deep n well plate 130, since deep n well plate 130 is coupled to a Vio voltage rather than Vdd. Using the same mask to form a second deep n well capacitor beneficially simplifies the physical design of the second deep n well capacitor and reduces mask costs.

FIG. 2B illustrates a more optimal second deep n well layer formed using a different mask than a first deep n well layer, in accordance with embodiments of the present invention. Deep n well capacitor 360 comprises a plurality of sub structures optimized to maximize the capacitance of deep n well capacitor 360. More specifically, the region beneath deep n well plate 130 is divided into multiple deep n well regions to increase surface area of the deep n well capacitor sub structures. For example, the projection of deep n well plate 130 is divided into deep n well capacitor sub structures 361, 362 and 363, with intervening epitaxy.

Alternatively, in accordance with other embodiments of the present invention, numerous aspects of the layout of a second deep n well layer can be changed when using a different mask to form the second layer. For example, if a first deep n well capacitor is formed comprising "horizontal" stripes, a second deep n well capacitor can be formed comprising "vertical" stripes at a different depth (or layer) of the integrated circuit. Interlayer couplings could be formed where the stripes "overlap," forming a lattice of n type material within the epitaxy. It is to be appreciated that interlayer couplings contribute additional capacitance.

Capacitance of multiple deep n well capacitors can be increased by interposing deep p well layer 370 between layers of deep n well, e.g., between n well capacitor 200 and n well capacitor 360. Deep p well layer 370 can advantageously utilize design rules that are relaxed relative to the deep n well regions. For example, p well layer 370 can comprise relatively large, plate-like structures.

In this manner, a variety of layers of deep n well capacitors can be formed, enabling the addition of significant amounts of capacitance to an integrated circuit for very small incremental design and manufacturing costs. Beneficially, the addition of such capacitances enables valuable increases in the maximum operating frequency of integrated circuits. Such faster operation is highly desirable and commands a premium price in the marketplace.

It is to be appreciated that deep n well capacitors may be coupled to voltages other than Vdd and ground, in accordance with embodiments of the present invention. Deep n well capacitors may be utilized for virtually any capacitive requirement on an integrated circuit, including within analog circuits, e.g., to produce an RC time constant.

Figure 3:
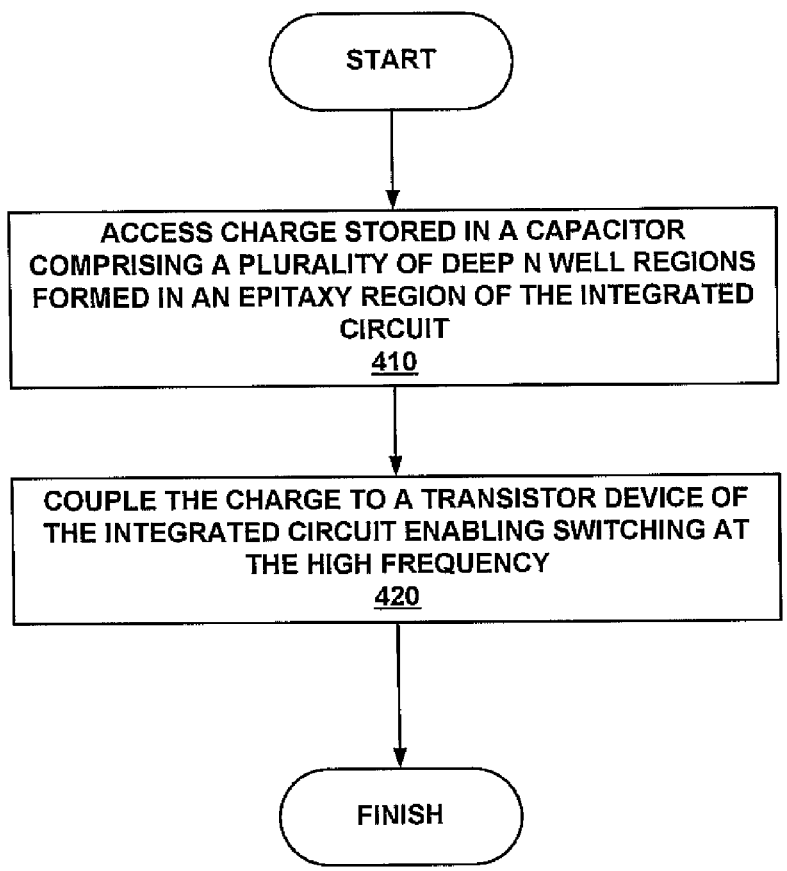
FIG. 3 illustrates a flow chart for a method of high frequency operation in an integrated circuit, in accordance with embodiments of the present invention.

FIG. 3 illustrates a flow chart for a method 400 of high frequency operation in an integrated circuit, in accordance with embodiments of the present invention.

In block 410, charge stored in a capacitor is accessed. The capacitor comprises a plurality of deep n well regions formed in an epitaxy region of the integrated circuit.

In block 420, the charge is coupled to a transistor device of the integrated circuit enabling switching at the high frequency. As previously discussed, highly integrated semiconductor devices, e.g., microprocessors, are limited to a maximum frequency of operation that is in large part limited by transient current capabilities of the integrated circuit packaging.

In this manner, charge required by switching transistors of an integrated circuit is accessed from an on-chip charge reservoir. Low inductance coupling between such on-chip charge reservoir(s), e.g., capacitors, and the switching transistors enables higher frequency operation of the integrated circuit than would otherwise be obtainable utilizing conventional systems and methods.

Embodiments in accordance with the present invention, deep n-well capacitor, are thus described. While the present invention has been described in particular embodiments, it should be appreciated that the present invention should not be construed as limited by such embodiments, but rather construed according to the below claims.

What is claimed is:

1. An integrated circuit comprising:
   one or more wells of a first conductivity type;
   one or more wells of a second conductivity type;
   a first plurality of transistors within said one or more wells of a first conductivity type;
   a second plurality of transistors within said one or more wells of a second conductivity type;
   a deep well of a second conductivity type disposed between said one or more wells of said first conductivity type and a substrate of said first conductivity type, wherein said deep well includes a plurality of substructures having a plurality of gaps between each of said one or more wells of said first conductivity type and said substrate of said first conductivity type, wherein said one or more wells of said first conductivity type are coupled to said substrate through said plurality of gaps, and wherein said substructures form a depletion region between said deep well and said substrate having a specified amount of decoupling capacitance for a principal operating potential coupled between said deep well and said substrate; and
   a separation well of said first conductivity type disposed within one or more of said gaps and coupling said one or more wells of said first conductivity type to said substrate.

2. The integrated circuit of claim 1, wherein said deep well is further coupled to said one or more wells of said second conductivity type and disposed between said one or more wells of said second conductivity type and said substrate.

3. The integrated circuit of claim 1, further comprising:
   one or more additional wells of said first conductivity type;
   one or more additional wells of said second conductivity type; and
   a second deep well of said second conductivity type disposed between said one or more additional wells of said first and second conductivity type and said substrate, wherein said one or more additional wells of said first conductivity type are isolated from said substrate by said second deep well.

4. The integrated circuit of claim 1, further comprising:
   one or more additional wells of said first conductivity type;
   one or more additional wells of said second conductivity type;
   a second deep well of said second conductivity type disposed between said one or more additional wells of said first and second conductivity type and said substrate, wherein said one or more additional wells of said first conductivity type are isolated from said substrate by said second deep well;
   a third deep well of said second conductivity type disposed beneath said first and second deep wells and substantially surrounded by said substrate, wherein said third deep well includes a plurality of substructures having said substrate disposed within gaps between said plurality of substructures of said third deep well and wherein said substructures of said third deep well form a depletion region between said third deep well and said substrate to provide an additional specified amount of decoupling capacitance for said principal operation potential; and
   an interlayer well of said second conductivity type coupling said deep well to said third deep well.

5. The integrated circuit of claim 1, wherein said separation well prevents said gaps from closing under bias conditions.

6. The integrated circuit of claim 1, wherein said separation well increases said decoupling capacitance between said first and second voltages.

7. An integrated circuit comprising:
   a substrate of a first conductivity type;
   an epitaxial layer of a first conductivity type disposed on said substrate;
   a first surface well of a second conductivity type coupled to a first voltage;
   a second surface well of said first conductivity type coupled to a second voltage; and
   a first deep well of said second conductivity type coupled to said first voltage by said first surface well, wherein said first deep well is disposed between said second surface well and said epitaxial layer, wherein said first deep well includes a plurality of sub-structures including a plurality of gaps, wherein said gaps provide connectivity between said second surface well and said epitaxial layer, and wherein a depletion region formed between said first deep well and said surrounding second surface well and epitaxial layer provides a decoupling capacitance between said first and second voltages.

8. The integrated circuit of claim 7, wherein said first deep well capacitor has a surface area selected to provide a specified amount of decoupling capacitance.

9. The integrated circuit of claim 7, wherein the width of said gaps do not close under bias conditions.

10. The integrated circuit of claim 7, further comprising a separation well of said first conductivity type disposed in one or more of said gaps between said sub-structures, wherein said separation well increases said decoupling capacitance between said first and second voltages.

11. The integrated circuit of claim 7, further comprising a separation well of said first conductivity type disposed in one or more of said gaps between said sub-structures, wherein said separation well reduces said separation required between said substructures such that said gaps between said depletion region does not close under bias conditions.

12. The integrated circuit of claim 7, wherein said substructures of said first deep well comprise substantially parallel stripes.

13. The integrated circuit of claim 7, wherein said substructures of said first deep well comprise a grid.

14. The integrated circuit of claim 7, further comprising:
a third surface well of said second conductivity type coupled to a third voltage; and
a fourth surface well of said first conductivity type coupled to a forth voltage, wherein said fourth surface well is isolated from said epitaxial layer by said third surface well, an additional deep well of said second conductivity type, and an additional surface well of said second conductivity type.

15. The integrated circuit of claim 7, further comprising:
a second deep well of said second conductivity type, wherein said second deep well is disposed in said epitaxial layer, wherein said second deep well includes a plurality of sub-structures that form a depletion region between said second deep well and said surrounding epitaxial layer to provide additional decoupling capacitance between said first and second voltages; and
an implant of said second conductivity type for coupling said second deep well to said first voltage by said first deep well and said first surface well.

16. The integrated circuit of claim 15, wherein said first and second deep wells are formed with said same process mask.

* * * * *